United States Patent
Leclerc-Perron et al.

(10) Patent No.: US 12,078,674 B2
(45) Date of Patent: Sep. 3, 2024

(54) MANAGING PHOTONIC INTEGRATED CIRCUIT OPTICAL COUPLING

(71) Applicant: Ciena Corporation, Hanover, MD (US)

(72) Inventors: Jérôme Leclerc-Perron, Québec (CA); Marie-Josee Picard, L'Ancienne-Lorette (CA); Raphael Beaupré-Laflamme, Quebec (CA)

(73) Assignee: Ciena Corporation, Hanover, MD (US)

( * ) Notice: Subject to any disclaimer, the term of this patent is extended or adjusted under 35 U.S.C. 154(b) by 225 days.

(21) Appl. No.: 17/903,542

(22) Filed: Sep. 6, 2022

(65) Prior Publication Data

US 2024/0077532 A1  Mar. 7, 2024

(51) Int. Cl.
| | | |
|---|---|---|
| *G01R 31/28* | (2006.01) | |
| *G01R 31/26* | (2020.01) | |
| *G02B 6/12* | (2006.01) | |
| *G02B 6/124* | (2006.01) | |
| *G02B 6/13* | (2006.01) | |

(52) U.S. Cl.
CPC ..... *G01R 31/2886* (2013.01); *G01R 31/2635* (2013.01); *G02B 6/124* (2013.01); *G02B 6/13* (2013.01); *G02B 2006/12107* (2013.01)

(58) Field of Classification Search
CPC ............ G01R 31/2886; G01R 31/2635; G01R 31/2831; G01R 31/308; G02B 6/124; G02B 6/13; G02B 2006/12107; G02B 6/4209; G02B 6/4214; G02B 6/34; G01M 11/30
USPC .................................................. 324/762.02
See application file for complete search history.

(56) References Cited

U.S. PATENT DOCUMENTS

| | | | | |
|---|---|---|---|---|
| 10,042,131 | B1* | 8/2018 | Lesea | G02B 6/12004 |
| 2005/0194990 | A1* | 9/2005 | Gothoskar | G02B 6/34 |
| | | | | 324/754.23 |
| 2019/0331859 | A1* | 10/2019 | Spannagel | G02B 6/4214 |
| 2020/0264375 | A1* | 8/2020 | Tokushima | G02B 6/29338 |
| 2020/0264391 | A1* | 8/2020 | Tummidi | G02B 6/424 |
| 2020/0278508 | A1* | 9/2020 | Israel | G02B 6/4249 |
| 2021/0096175 | A1* | 4/2021 | Frankel | G01R 31/308 |

(Continued)

FOREIGN PATENT DOCUMENTS

| | | | | |
|---|---|---|---|---|
| EP | 3974881 | A1 * | 3/2022 | ......... G02B 6/12002 |
| WO | WO-2019197320 | A1 * | 10/2019 | ............. G01R 1/071 |

OTHER PUBLICATIONS

Jenoptik "Wafer-Level PIC Testing", Optical Solution for Wafer-Level PIC Testing, Jan. 20, 2020, pp. 1-8, Retrieved from Internet URL: https://www.jenoptik.com.cn/-/media/websitedocuments/optics/microoptics/ufo-probe-card_wafer-level-pic-testing_overview-public.pdf.

*Primary Examiner* — Tung X Nguyen
*Assistant Examiner* — Robert P Alejnikov, Jr.
(74) *Attorney, Agent, or Firm* — Young Basile Hanlon & MacFarlane, P.C.

(57) ABSTRACT

An apparatus for testing a wafer or chip comprising a photonic integrated circuit comprises: an electrical signal interface module comprising an array of movable conducting structures; a photonic signal interface module attached to the electrical signal interface module, the photonic signal interface module comprising one or more optical fiber interfaces, and a first set of grating couplers arranged over at least a first plane of the photonic signal interface module; and one or more electrical signal connections between the electrical signal interface module and the photonic signal interface module.

21 Claims, 20 Drawing Sheets

(56) References Cited

U.S. PATENT DOCUMENTS

2021/0159659 A1\* 5/2021 Bandyopadhyay ......................... H01S 3/094053

\* cited by examiner

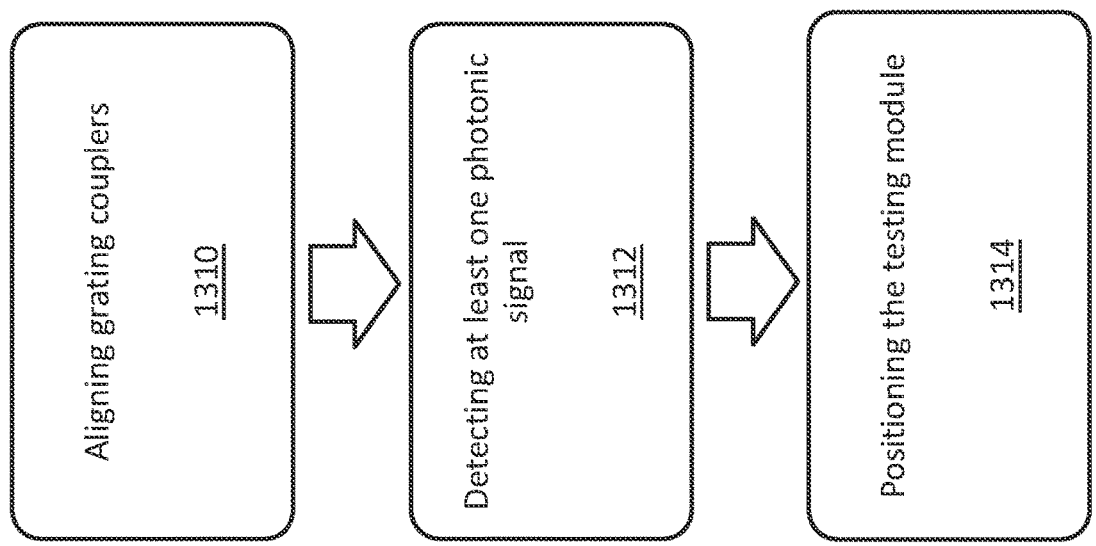

MANAGING PHOTONIC INTEGRATED CIRCUIT OPTICAL COUPLING

TECHNICAL FIELD

This disclosure relates to managing photonic integrated circuit optical coupling.

BACKGROUND

The production of photonic chips can be aided by the implementation of tests performed at the wafer level rather than at the level of the individual dies comprising the wafer. If the wafer is to be optically tested, a testing apparatus can be configured to transmit the required light. For instance, a regularly pitched vertical fiber array, typically with spacings of around 250 µm, can be mounted on a six-axis movement stage in order to perform alignment with respect to the wafer. Another approach could use a regularly pitched horizontal fiber array, with the addition of a monolithic glass structure or with a glass waveguide interposer capable of redirecting light at a 90 degree angle. Horizontal fiber arrays can also be mounted on a six-axis movement stage in order to perform alignment with respect to the wafer.

SUMMARY

In one aspect, in general, an apparatus for testing a wafer or chip comprising a photonic integrated circuit comprises: an electrical signal interface module comprising an array of movable conducting structures; a photonic signal interface module attached to the electrical signal interface module, the photonic signal interface module comprising one or more optical fiber interfaces, and a first set of grating couplers arranged over at least a first plane of the photonic signal interface module; and one or more electrical signal connections between the electrical signal interface module and the photonic signal interface module.

Aspects can include one or more of the following features.

The wafer or chip comprises a second set of grating couplers on a surface of the wafer or chip, and a spatial arrangement of the first set of grating couplers is substantially identical to a spatial arrangement of the second set of grating couplers.

A first grating coupler in the first set of grating couplers has a substantially identical shape as a second grating coupler in the second set of grating couplers, and the shapes of the first and second grating couplers are rotated by 180 degrees with respect to each other when in proximity to each other after the arrangement of the first set of grating couplers is aligned to the arrangement of the second set of grating couplers.

The wafer or chip comprises a second set of grating couplers on a surface of the wafer or chip, and the photonic signal interface module further comprises at least one photodetector coupled to at least one photonic signal propagating between the photonic signal interface module and the wafer or chip through at least one pair of aligned grating couplers consisting of a grating coupler in the first set of grating couplers and a grating coupler in the second set of grating couplers.

The photonic signal interface module further comprises a photonic circuit that comprises at least one optical splitter configured to couple portions of photonic signals including a first portion being coupled to or from the wafer or chip and a second portion being coupled to a photodetector on the photonic signal interface module coupled to at least one of the electrical signal connections.

The optical splitter is configured to couple the first portion to the wafer or chip and the second portion to a first photodetector on the photonic signal interface module coupled to at least one of the electrical signal connections, and the optical splitter is configured to couple a third portion reflected from a Sagnac loop retro-reflector in the wafer or chip to a second photodetector on the photonic signal interface module coupled to at least one of the electrical signal connections.

The photonic signal interface module further comprises an interferometric photonic circuit that comprises at least one optical phase shifter configured to apply an optical phase shift to a photonic signal based on an electrical signal propagating between the electrical signal interface module and the photonic signal interface module through at least one of the electrical signal connections.

The first plane of the photonic signal interface module is coincident with a surface of the photonic signal interface module that is in proximity to a surface of the wafer or chip.

In another aspect, in general, a method for fabricating a testing module for testing a wafer or chip comprising a photonic integrated circuit comprises: forming an electrical signal interface module comprising an array of movable conducting structures; forming a photonic signal interface module attached to the electrical signal interface module, the photonic signal interface module comprising one or more optical fiber interfaces, and a first set of grating couplers arranged over at least a first plane of the photonic signal interface module; and forming one or more electrical signal connections between the electrical signal interface module and the photonic signal interface module.

Aspects can include one or more of the following features.

The wafer or chip comprises a second set of grating couplers on a surface of the wafer or chip, and a spatial arrangement of the first set of grating couplers is substantially identical to a spatial arrangement of the second set of grating couplers.

A first grating coupler in the first set of grating couplers has a substantially identical shape as a second grating coupler in the second set of grating couplers, and the shapes of the first and second grating couplers are rotated by 180 degrees with respect to each other when in proximity to each other after the arrangement of the first set of grating couplers is aligned to the arrangement of the second set of grating couplers.

The wafer or chip comprises a second set of grating couplers on a surface of the wafer or chip, and the photonic signal interface module further comprises at least one photodetector coupled to at least one photonic signal propagating between the photonic signal interface module and the wafer or chip through at least one pair of aligned grating couplers consisting of a grating coupler in the first set of grating couplers and a grating coupler in the second set of grating couplers.

The photonic signal interface module further comprises a photonic circuit that comprises at least one optical splitter configured to couple portions of photonic signals including a first portion being coupled to or from the wafer or chip and a second portion being coupled to a photodetector on the photonic signal interface module coupled to at least one of the electrical signal connections.

The photonic signal interface module further comprises an interferometric photonic circuit that comprises at least one optical phase shifter configured to apply an optical phase shift to a photonic signal based on an electrical signal propagating between the electrical signal interface module and the photonic signal interface module through at least one of the electrical signal connections.

In another aspect, in general, a method for testing a wafer or chip comprising a photonic integrated circuit comprises: aligning a first set of grating couplers on a testing module to a second set of grating couplers on a surface of the wafer or chip, where the testing module comprises an electrical signal interface module comprising an array of movable conducting structures, and a photonic signal interface module attached to the electrical signal interface module comprising one or more optical fiber interfaces, and the first set of grating couplers arranged over at least a first plane of the photonic signal interface module; detecting at least one photonic signal propagating between the photonic signal interface module and the wafer or chip through at least one pair of the aligned grating couplers; and positioning the testing module relative to the wafer or chip to form electrical contacts between the array of movable conducting structures and respective contact pads on the surface of the wafer or chip, and maintaining detection of the photonic signal during the positioning.

Aspects can include one or more of the following features.

Positioning the testing module relative to the wafer or chip comprises controlling a controllable lens that in proximity to at least one grating coupler in the first set of grating couplers.

Controlling the controllable lens comprises at least one of: tuning an index of refraction of the lens using an electric field applied in response to an electrical signal from the electrical signal interface module, or adjusting a position of the lens using a micro-electromechanical system controlled based on an electrical signal from the electrical signal interface module.

A spatial arrangement of the first set of grating couplers is substantially identical to a spatial arrangement of the second set of grating couplers.

A first grating coupler in the first set of grating couplers has a substantially identical shape as a second grating coupler in the second set of grating couplers, and the shapes of the first and second grating couplers are rotated by 180 degrees with respect to each other when in proximity to each other after the arrangement of the first set of grating couplers is aligned to the arrangement of the second set of grating couplers.

The photonic signal interface module comprises at least one photodetector coupled to at least one photonic signal propagating between the photonic signal interface module and the wafer or chip through at least one pair of aligned grating couplers consisting of a grating coupler in the first set of grating couplers and a grating coupler in the second set of grating couplers.

The photonic signal interface module comprises a photonic circuit that comprises at least one optical splitter configured to couple portions of photonic signals including a first portion being coupled to or from the wafer or chip and a second portion being coupled to a photodetector on the photonic signal interface module coupled to at least one of the electrical signal connections.

Aspects can have one or more of the following advantages.

Some implementations of the photonic chip interposer described herein allow for the co-packaging of chip-to-chip surface couplers with electrical probes to concurrently electrically and optically probe a wafer. Furthermore, the photonic chip interposer facilitates the integration of passive or active photonic circuitry close to the wafer for testing and measurement. The photonic chip interposer could allow for production lines to move from an R&D setup to a custom designed photonic chip designed for the footprint of the wafer being tested, thus increasing production throughput and improving test station maintenance and tuning. The photonic chip interposer also enables new alignment metrology (e.g., chip-to-chip surface couplers) for the 6-axis alignment (e.g., movement with 6 degrees of freedom including translation over each of 3 orthogonal axes, and pitch, yaw, and roll rotation about those 3 axes) of the photonic light injection die with respect to the device under test (DUT). The techniques described herein can be used for high-volume production of complex photonic chips, and are reliable enough for standardizing various production tests of photonic chips.

The optical probing techniques can be used with a variety of wavelength ranges. For example, some electromagnetic waves have a spectrum that has a peak wavelength that falls in a particular range of optical wavelengths (e.g., between about 100 nm to about 1 mm, or some subrange thereof), also referred to as optical waves, light waves, or simply light.

Other features and advantages will become apparent from the following description, and from the figures and claims.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIGS. 13A and 13B are flowcharts for procedures for aligning and testing a wafer.

DETAILED DESCRIPTION

Light coupling to photonic chips or wafers, such as silicon photonics (SiPhot) chips or wafers, can be achieved through the injection of light onto a surface grating coupler via fiber optics, typically with a fiber array assembly. The coupling efficiency is then related to the quality of the match between the optical mode of the incident light source and the optical mode of the surface grating coupler. Electrical signals from the chip or wafer are typically acquired with a separate electrical probe. Such optical and electrical probes may require bulky mechanical assemblies that are hard to scale up when multiple devices under test are present on the chip or wafer.

To address some of these challenges, various techniques described herein use a photonic chip interposer, which is able to route light from a fiber through an optical coupler that is part of the interposer that is attached to a probe card and is aligned to a corresponding optical coupler on the chip or wafer hosting the devices under test (DUTs). The one or more optical couplers on the photonic chip interposer are coupled to waveguides, and the waveguides are optically coupled to as many optical fibers as required. The optical fibers can be arranged in a fiber array assembly and butt-coupled into the photonic chip interposer. Waveguides on the chip or wafer can then route light that has been coupled between pairs of optical couplers to match any pattern of DUTs arranged within the chip or wafer, allowing for easier integration with probe cards, as described in more detail below. The photonic chip interposer enables optically and electrically probing multiple chips that are included on a wafer concurrently, dividing the time required to test the whole wafer. Some implementations use optical couplers on the photonic chip interposer that are grating couplers to enable the use of a grating coupler to grating coupler interface, thus reducing losses during wafer testing, as described in more detail herein.

A wafer can be fabricated to include multiple photonic chips, as well as other devices, thus simplifying and expediting manufacturing by combining the creation of multiple devices onto one wafer. Wafers are then typically diced into segments (each comprising an individual chip or "die") corresponding to their constituent devices. The various implementations of a photonic chip interposer could test a few photonic chip devices on the wafer, or all of them.

Figure 1A:
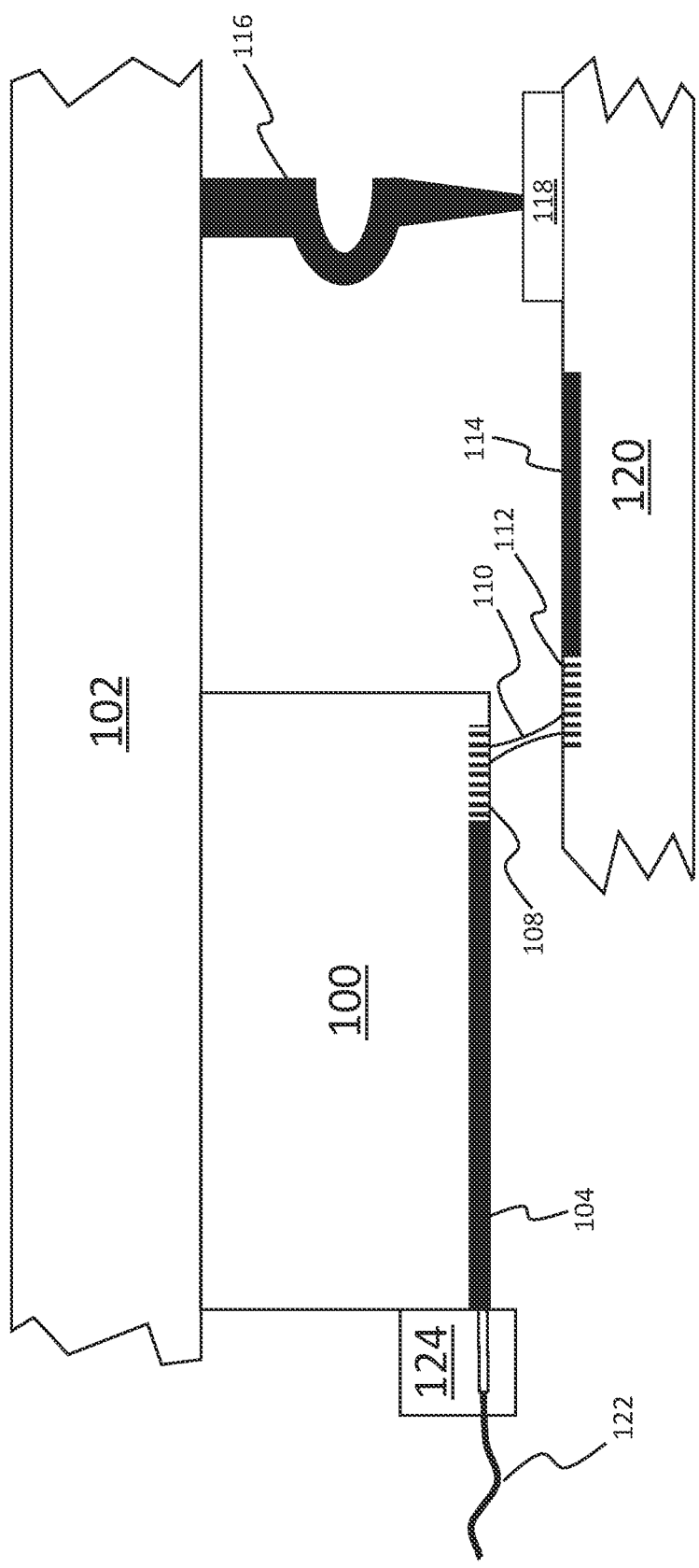
FIG. 1A is a schematic diagram of a portion of a system for testing a wafer, viewed from the side.

FIG. 1A shows a portion of a system used for testing a wafer 120 as viewed from the side, the wafer 120 comprising a photonic integrated circuit. The system includes an electrical signal interface module 102 comprising an array of spring coupled conducting structures 116. The array of spring coupled conducting structures 116 connect to the wafer 120 at corresponding electrical contacts 118 and allow for electrical control and readout of devices in the wafer 120. A photonic signal interface module 100 is attached to the electrical signal interface module 102. For example, in some implementations, the attachment of the photonic signal interface module 100 to the electrical signal interface module 102 includes rigidly attaching the modules together, such as with the use of a bonding material between rigid surfaces of the modules and/or a rigid member that is attached to both modules. The photonic signal interface module 100 includes optical fiber interfaces 124, which couple light from an optical fiber of a fiber array 122 into a first waveguide 104. The first waveguide 104 transmits light to a first grating coupler 108 arranged over at least a first plane of the photonic signal interface module 100. In some implementations, the plane is coincident with a surface of the photonic signal interface module 100 (e.g., a surface in proximity to a surface of the wafer 120). The chip-to-chip optical beam 110 is transmitted from the first grating coupler 108 and coupled to a second grating coupler 112 on a surface of the wafer 120, which is itself coupled to a second waveguide 114 on the wafer 120.

A variety of alternative implementations can be used. In some alternative implementations, instead of spring coupled conducting structures 116, another form of movable conducting structure can be implemented (e.g., using an electrically conductive elastomer).

Figure 1B:
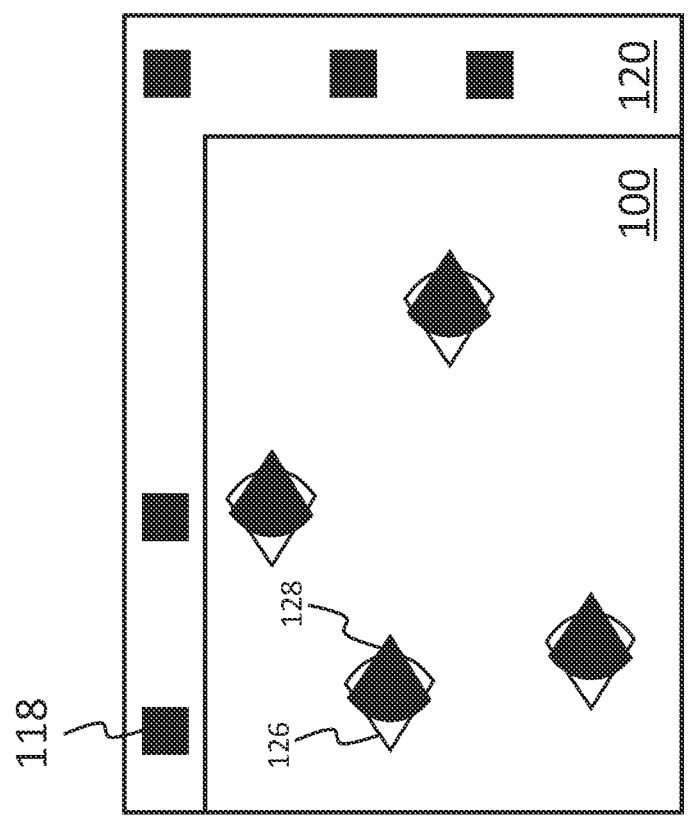
FIG. 1B is a schematic diagram of a portion of a system for testing a wafer, viewed from above.

FIG. 1B shows a portion of a system used for testing the wafer 120. A grating coupler 126 providing a transmitted optical mode of the photonic signal interface module 100 is coupled to a received optical mode of a grating coupler 128 of the wafer 120. In some implementations, the grating couplers are fabricated to have a "fan" shape that extends from a coupled optical waveguide to a curved edge, where the orientation of these shapes are opposite from each other, as shown in FIG. 1B, to accommodate the shape of the optical mode between the two grating couplers. In other words, these substantially identical shapes are rotated by 180 degrees with respect to each other when in proximity to each other after the arrangements of grating couplers in the photonic signal interface module 100 and the wafer 120 are aligned with each other. Electrical pads 118 are located on the wafer 120 and are electrically connected to the electrical signal interface module 102.

A photonic chip interposer enables additional test features and optical circuitry to be integrated directly on the photonic chip interposer, such as variable optical attenuators (VOAs), polarization rotators, reflectors, delay lines, photodetectors, etc. The photonic chip interposer enables such instrumentation to be located closer to the DUT on the wafer (e.g., a few centimeters away) than would be possible if such instrumentation had to be fiber coupled (e.g., from a few meters away), potentially improving the calibration of measurements.

Figure 2A:
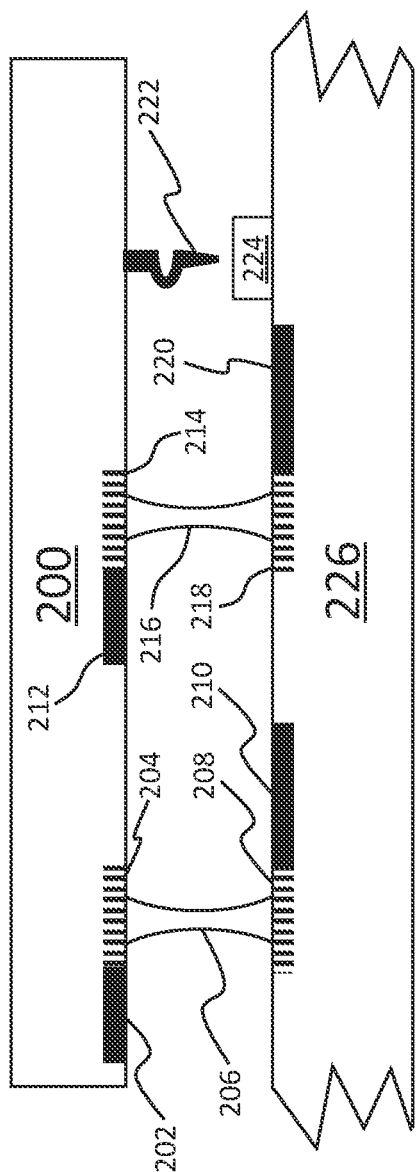
FIG. 2A is a schematic diagram of a portion of a system for testing a wafer, viewed from the side.

FIG. 2A shows an example portion of a system used for testing a wafer 226. Light in a waveguide 202 is transmitted to a grating coupler 204. A chip-to-chip optical beam 206 is transmitted from the grating coupler 204 and coupled to a grating coupler 208, which is itself coupled to a waveguide 210. Any number of such grating coupler pairs can be included for multiple optical probe connections. For example, light in a waveguide 212 is transmitted to a grating coupler 214. A chip-to-chip optical beam 216 is transmitted from the grating coupler 214 and coupled to a grating coupler 218, which is itself coupled to a waveguide 220. One or more grating couplers can be used to provide a signal that is related to the alignment of the photonic signal interface module 200 with the wafer 226, providing information on position and relative angle. In such testing, the photonic signal interface module 200 may be operated such that the spring coupled conducting structure 222 is not in electrical contact with the electrical pad 224. Grating couplers may be included with the sole purpose of insuring coplanarity between the photonic chip interposer and the wafer.

Figure 2B:
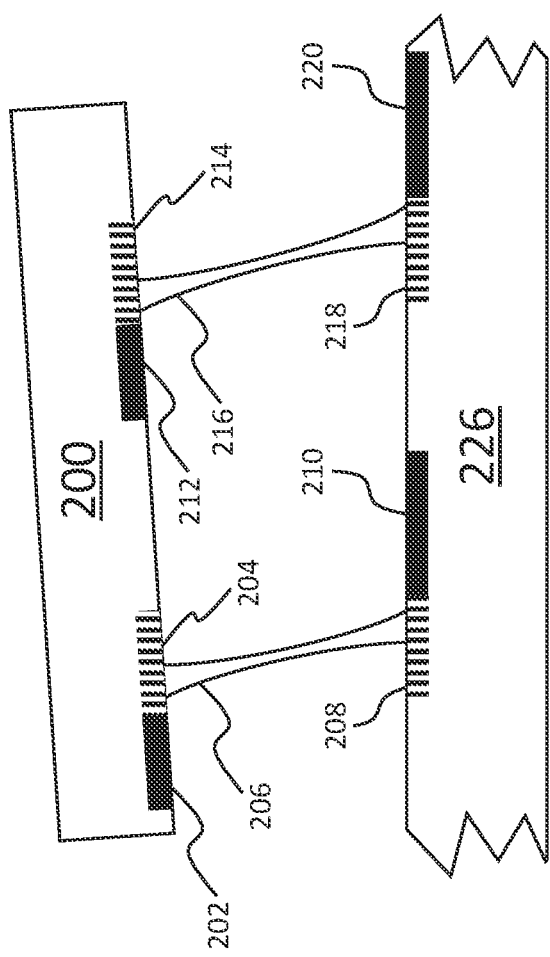
FIG. 2B is a schematic diagram of a portion of a system for testing a wafer, viewed from the side.

FIG. 2B shows an example of alignment metrology using the portion of the system shown in FIG. 1B. Several grating coupler pairs can be used to provide a feedback signal that varies with the coplanarity accuracy. The working distance of each grating coupler pair could help to provide this feedback, since the optical coupling losses would increase when the distance between the photonic signal interface module 200 and the wafer 226 is too large or too small.

Figure 3A:
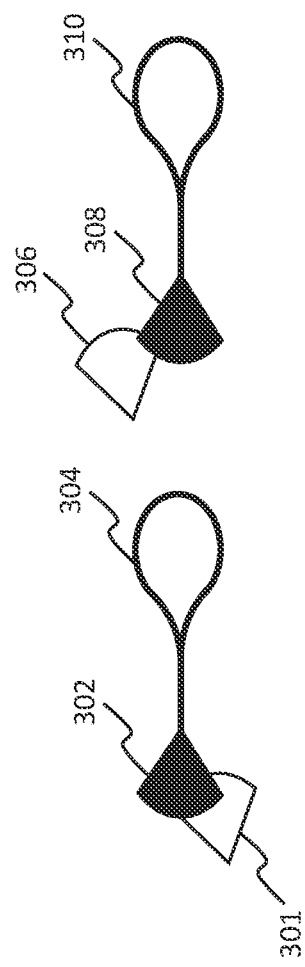
FIGS. 3A and 3B are schematic diagrams of a portion of a system for testing a wafer, before and after alignment, respectively.
Figure 3B:
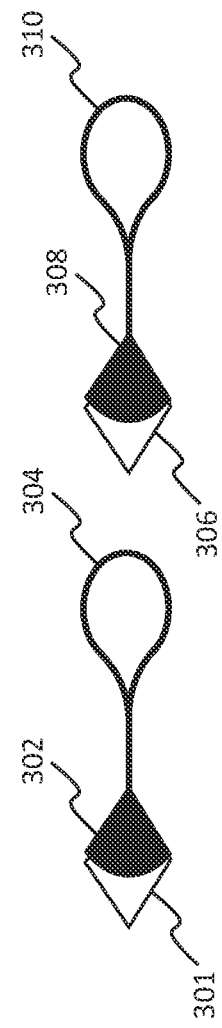

FIGS. 3A and 3B show a portion of a system used for testing a wafer. One or more grating couplers can be used to provide feedback for alignment metrology instead of for coupling to devices under test on the wafer. A first calibration pair of grating couplers in this example enable feedback of the overlap of a transmitted optical mode of a grating coupler 301 (on a photonic signal interface module, not show in these figures) with respect to a received optical mode of a grating coupler 302 on a wafer (not shown), which is itself coupled to a reflecting component 304 (e.g., a Sagnac loop retro-reflector) on the wafer to provide that feedback. A second calibration pair of grating couplers in this example enable feedback of the overlap of a transmitted optical mode of a grating coupler 306 (also on the photonic signal interface module) with respect to a received optical mode of a grating coupler 308 on the wafer, which is itself coupled to a reflecting component 310 on the wafer to provide that feedback. In this example, the modal overlap shown in FIG. 3A of each grating coupler 301, 306 and its corresponding grating coupler 302, 308, respectively, is less than the modal overlap shown in FIG. 3B. The reflecting components 304, 310 return light to the photonic signal interface module, thus allowing the amount of modal overlap of some number of calibration pairs of grating couplers to be measured and used to calibrate the alignment of other pairs of grating couplers that couple light to devices under test. The measured feedback signals can be used to determine whether to perform rotations (as in this example), and/or translations to achieve alignment.

Figure 3C:
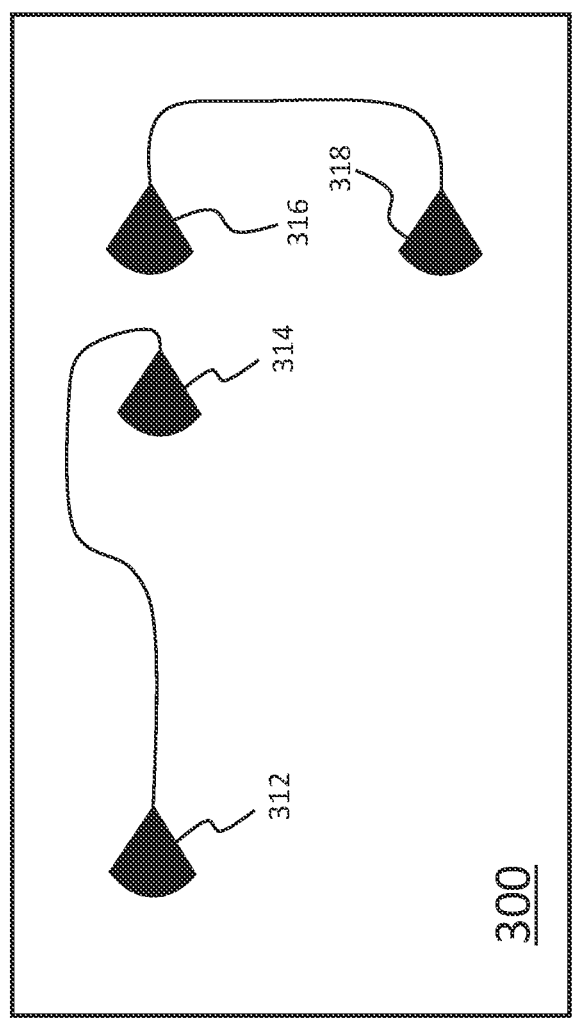
FIG. 3C is a schematic diagram of a portion of a system for testing a wafer.

FIG. 3C shows an example portion of a system used for testing a wafer 300. A first grating coupler 312 can transmit light (e.g., via a waveguide) to a second grating coupler 314. Additionally, a third grating coupler 316 can transmit light to a fourth grating coupler 318. Several grating coupler pairs can be used to provide a feedback signal that varies with the coplanarity accuracy. For example, the coplanarity of the photonic signal interface module with the wafer can be measured by the coupling efficiency of the first grating coupler 312 with a respective grating coupler on the photonic signal interface module and the coupling efficiency of the second grating coupler 314 with a respective grating coupler on the photonic signal interface module.

Figure 4:
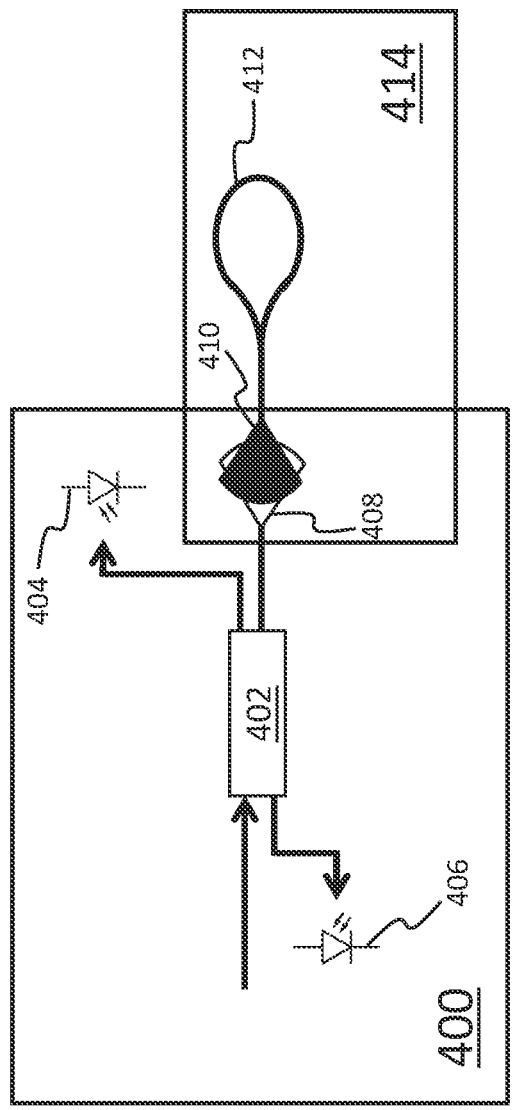
FIG. 4 is a schematic diagram of a portion of a system for testing a wafer.

FIG. 4 shows an example portion of a system used for testing a wafer 414. Light on the photonic signal interface module 400 is split by a splitter 402 (in this example, a 2-by-2 optical splitter with two input ports and two output ports) into two paths, with part of the light directed to a first photodiode 404 and the remainder of the light coupled from a first grating coupler 408 to a second grating coupler 410, located on the wafer 414. The second grating coupler 410 can be coupled to a reflecting component 412 (e.g., a Sagnac loop retro-reflector) to reflect the light back to the second grating coupler 410. The reflected light, after being coupled back to the photonic signal interface module 400 via the first grating coupler 408, is then split by the splitter 402, with a portion of the light sent to a second photodiode 406. A first signal from the first photodiode 404 and a second signal from the second photodiode 406 can be used to determine the optical coupling efficiency between the photonic signal interface module 400 and the wafer 414, thus providing a metric for alignment. The first signal from the first photodiode 404 can also be used to calibrate the input optical power. In some implementations, other photonic elements can be used. For example, a different kind of photodetector can be used other than a photodiode.

Figure 5:
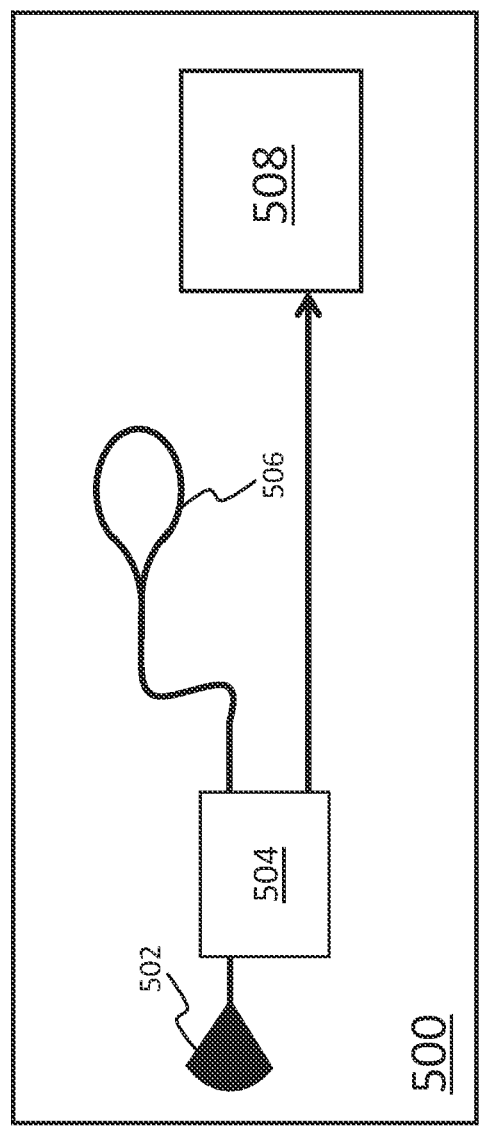
FIG. 5 is a schematic diagram of a portion of a system for testing a wafer.

FIG. 5 shows an example portion of a system used for testing a wafer 500. Light is transmitted onto the wafer 500 via a grating coupler 502 and is split by a splitter 504 into two paths, with part of the light directed to a reflecting component 506 and the remainder of the light sent to an element 508 under test. The reflected light is then sent split by the splitter 504, with a part of the light coupled back into the grating coupler 502. The light coupled back into the grating coupler 502 can then be measured, thus providing a measure of the coupling losses from the grating coupler 502 and other components located before the grating coupler 502. In alternative implementations, optical components such as this can be included on the photonic signal interface module to aid in various testing procedures.

A Sagnac loop retro-reflector located on the wafer can facilitate the calibration of the chip-to-chip losses. The reflected back light can be captured on the photonic chip interposer with an extra splitter and integrated photodiodes for direct signal referencing and grating coupler insertion loss extraction. This extra function, that could be combined with a grating coupler design more tolerant to alignment, could allow the possibility to perform faster passive alignment and machine vision assisted alignment. Alignment may also benefit from feedthrough holes of lithographic definition for detection of markers on wafer with machine vision systems. The holes could be created by cavities defined by a fab deep-trench step (e.g., a Bosch process) and post-processed wafer thinning. It is also possible to design a grating coupler with longer working distance and better tolerance to alignment, mainly by increasing the output beam size. Some implementations can also prioritize the design of a nearly vertical output beam to facilitate the alignment procedure of the electrical and/or optical probes.

Figure 6:
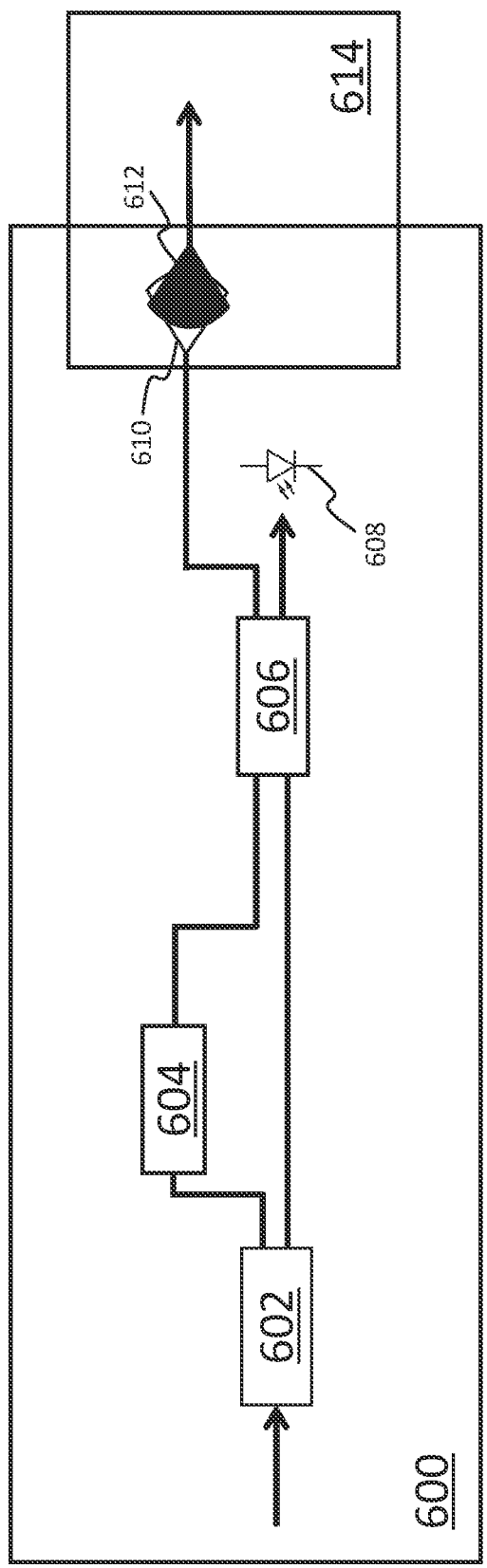
FIG. 6 is a schematic diagram of a portion of a system for testing a wafer.

FIG. 6 shows an example of active device integration in the photonic signal interface module 600. A first splitter 602 splits the incoming light and a thermal phase shifter 604 induces a tunable phase difference between the two paths. The phase difference can also be passive, for example if the waveguide length is different between the two paths. A second splitter 606 combines the two paths, thus creating an interferometric pattern in both paths. A monitoring photodiode 608 can detect the interferometric pattern from one path after the splitter 606 and provide a feedback signal used to control the thermal phase shifter 604. A second path after the splitter 606 can contain light with an interferometric pattern which is sent to a first grating coupler 610 and is received by a second grating coupler 612 located on the wafer 614. Other active device integration schemes are also possible, such as using a variable optical attenuator in the path of the light to tune the optical power, or by using a modulator for transient testing of the wafer.

Figure 7A:
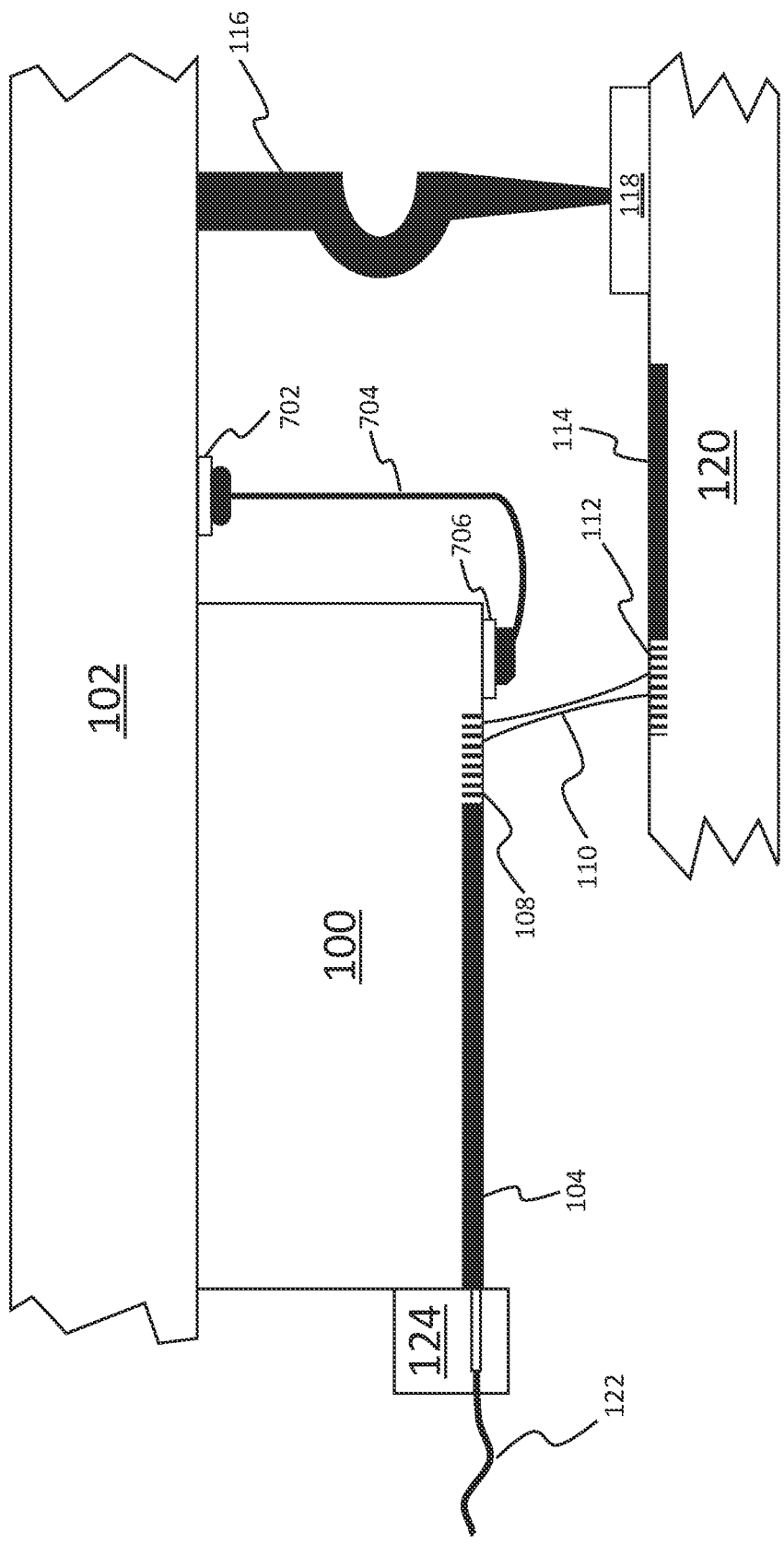
FIG. 7A is a schematic diagram of a portion of a system for testing a wafer, viewed from the side.

FIG. 7A shows a portion of a system used for testing the wafer 120. The photonic signal interface module 100 includes one or more electrical signal connections between the electrical signal interface module 102 and the photonic signal interface module 100. For example, a wire bond 704 can electrically connect to a first pad 702 located on the electrical signal interface module 102 and a second pad 706 located on the photonic signal interface module 100.

Figure 7B:
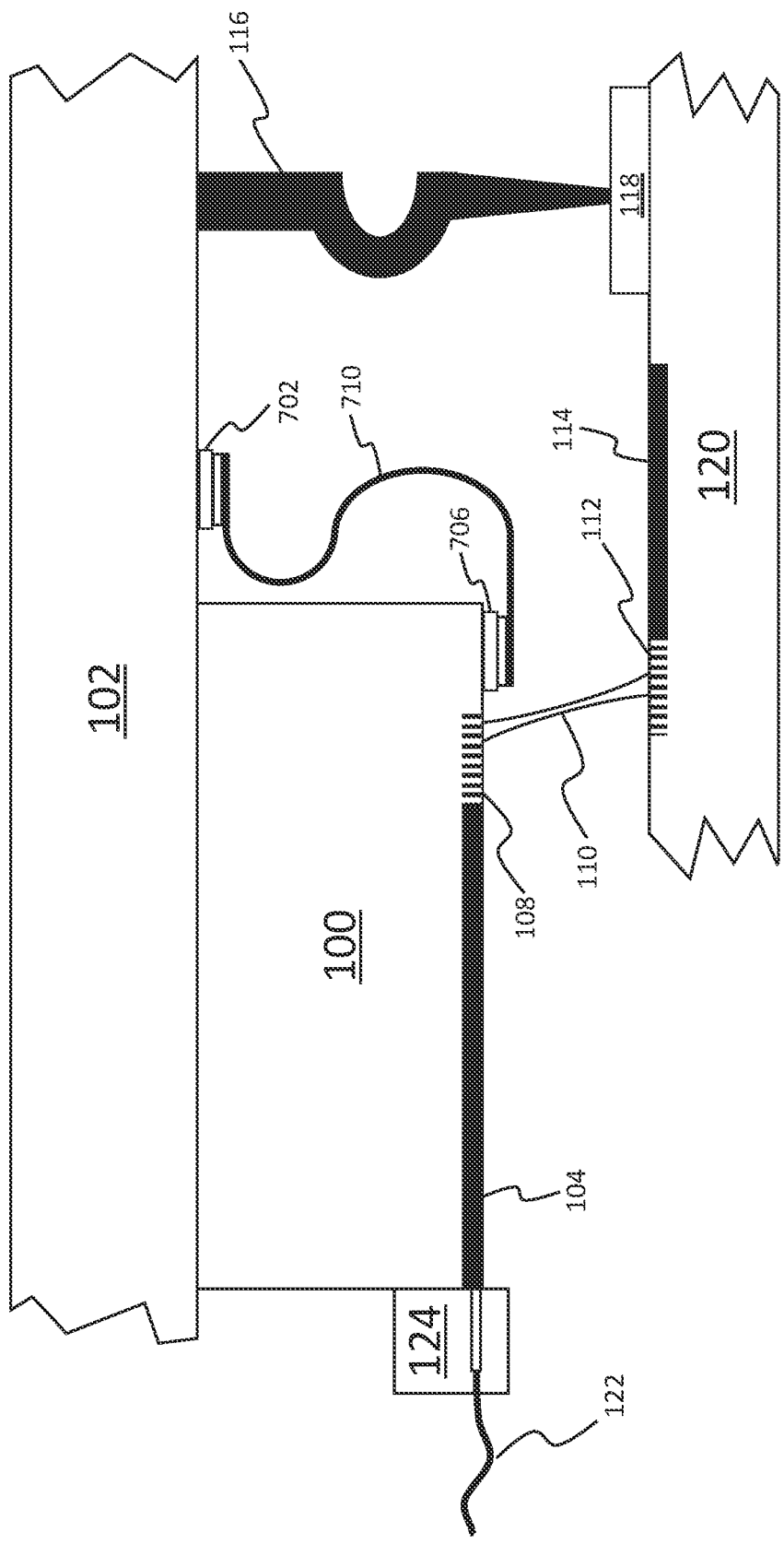
FIG. 7B is a schematic diagram of a portion of a system for testing a wafer, viewed from the side.

FIG. 7B shows a portion of a system used for testing the wafer 120. The photonic signal interface module 100 includes one or more electrical signal connections between the electrical signal interface module 102 and the photonic signal interface module 100. For example, a flexible electrical connection 710 can electrically connect to the first pad 702 located on the electrical signal interface module 102 and the second pad 706 located on the photonic signal interface module 100.

Figure 8:
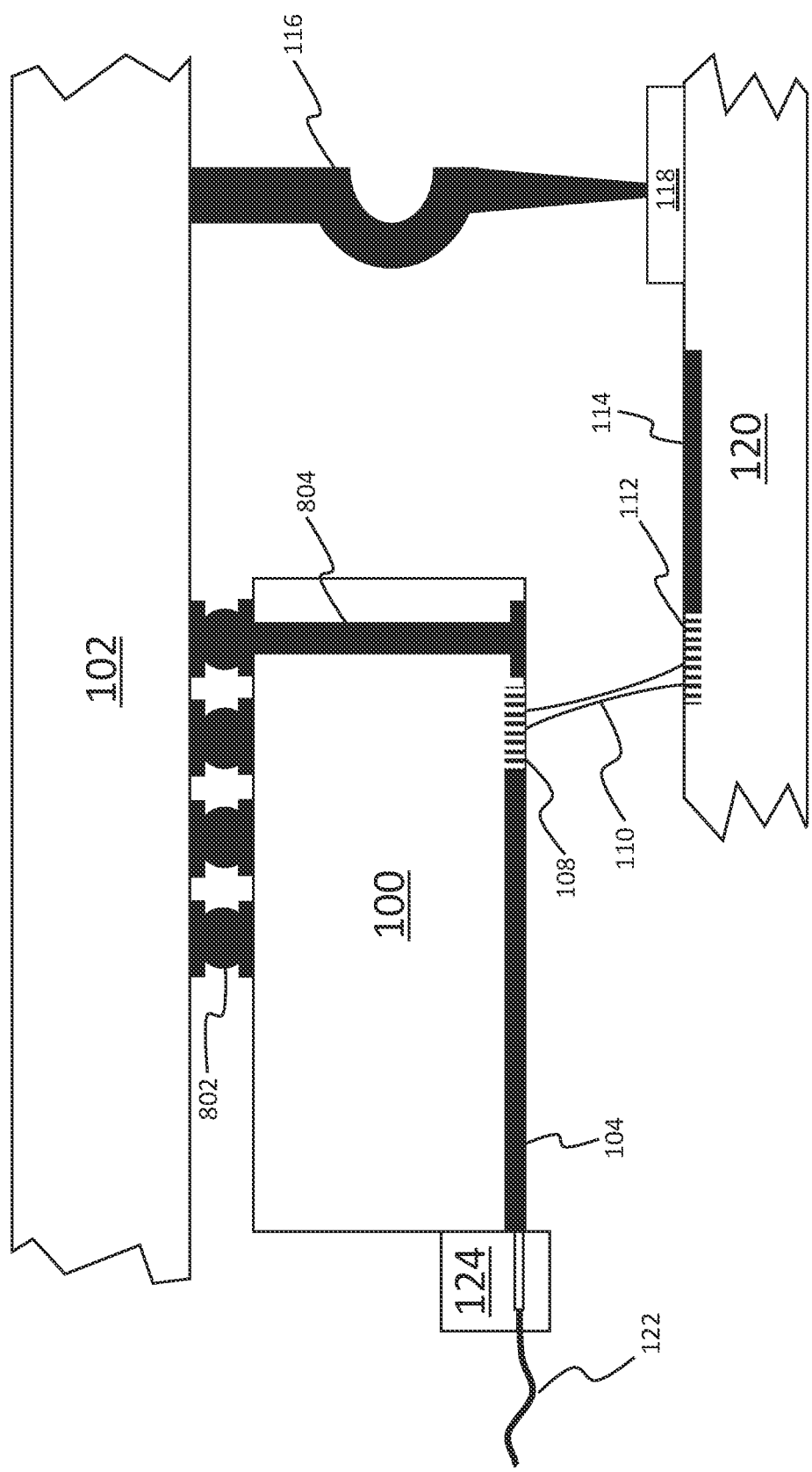
FIG. 8 is a schematic diagram of a portion of a system for testing a wafer, viewed from the side.

FIG. 8 shows a portion of a system used for testing the wafer 120. The photonic signal interface module 100 includes one or more electrical signal connections between the electrical signal interface module 102 and the photonic signal interface module 100. For example, balls or copper pillars 802 can electrically connect the electrical signal interface module 102 and the photonic signal interface module 100. Vias 804 can electrically connect the epitaxial active components (not shown) to the underside of the photonic signal interface module 100.

Figure 9:
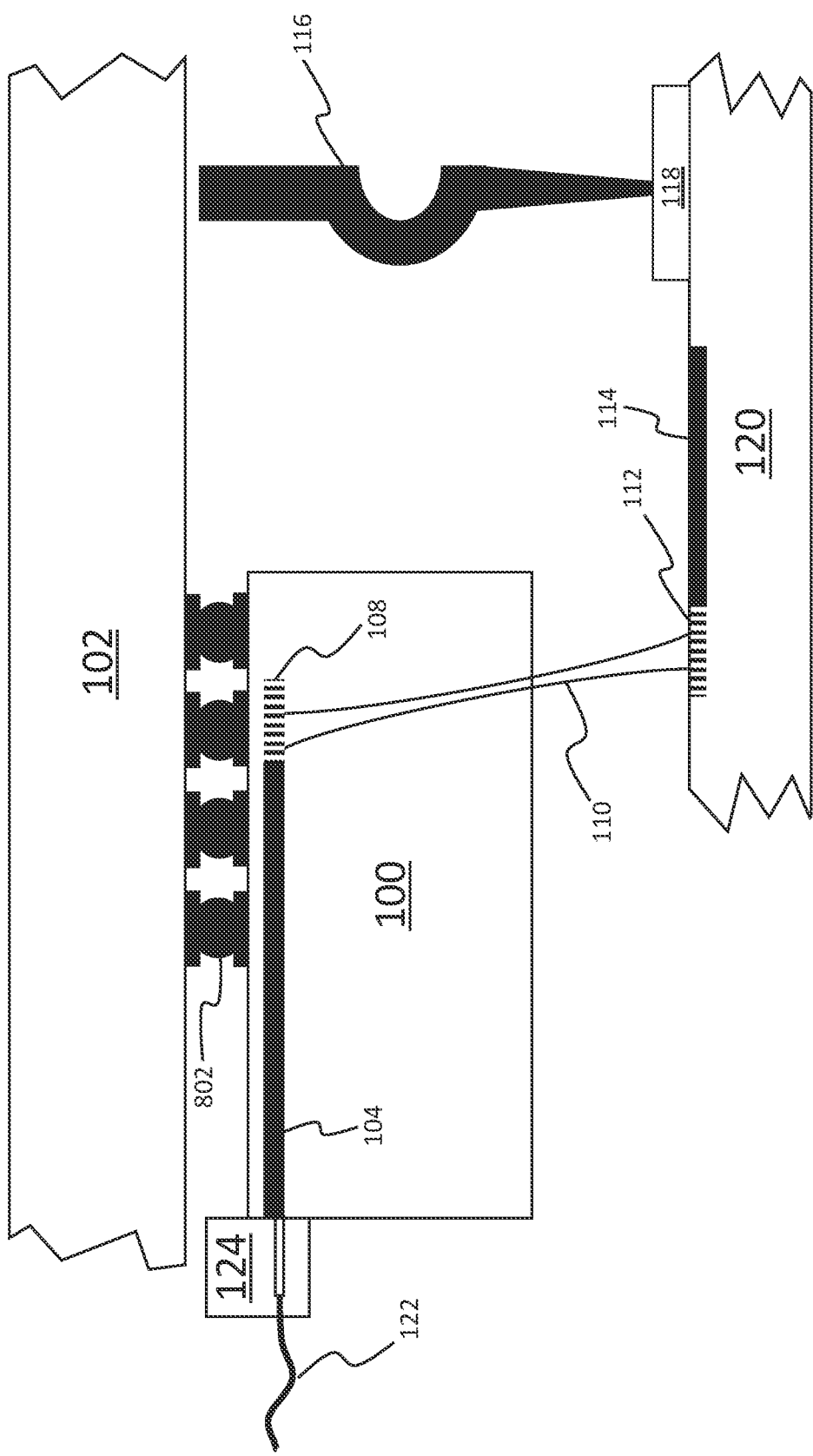
FIG. 9 is a schematic diagram of a portion of a system for testing a wafer, viewed from the side.

FIG. 9 shows a portion of a system used for testing the wafer 120. The chip-to-chip optical beam 110 can traverse through a portion of the photonic signal interface module 100 (e.g., a portion that is optically transparent).

Figure 10:
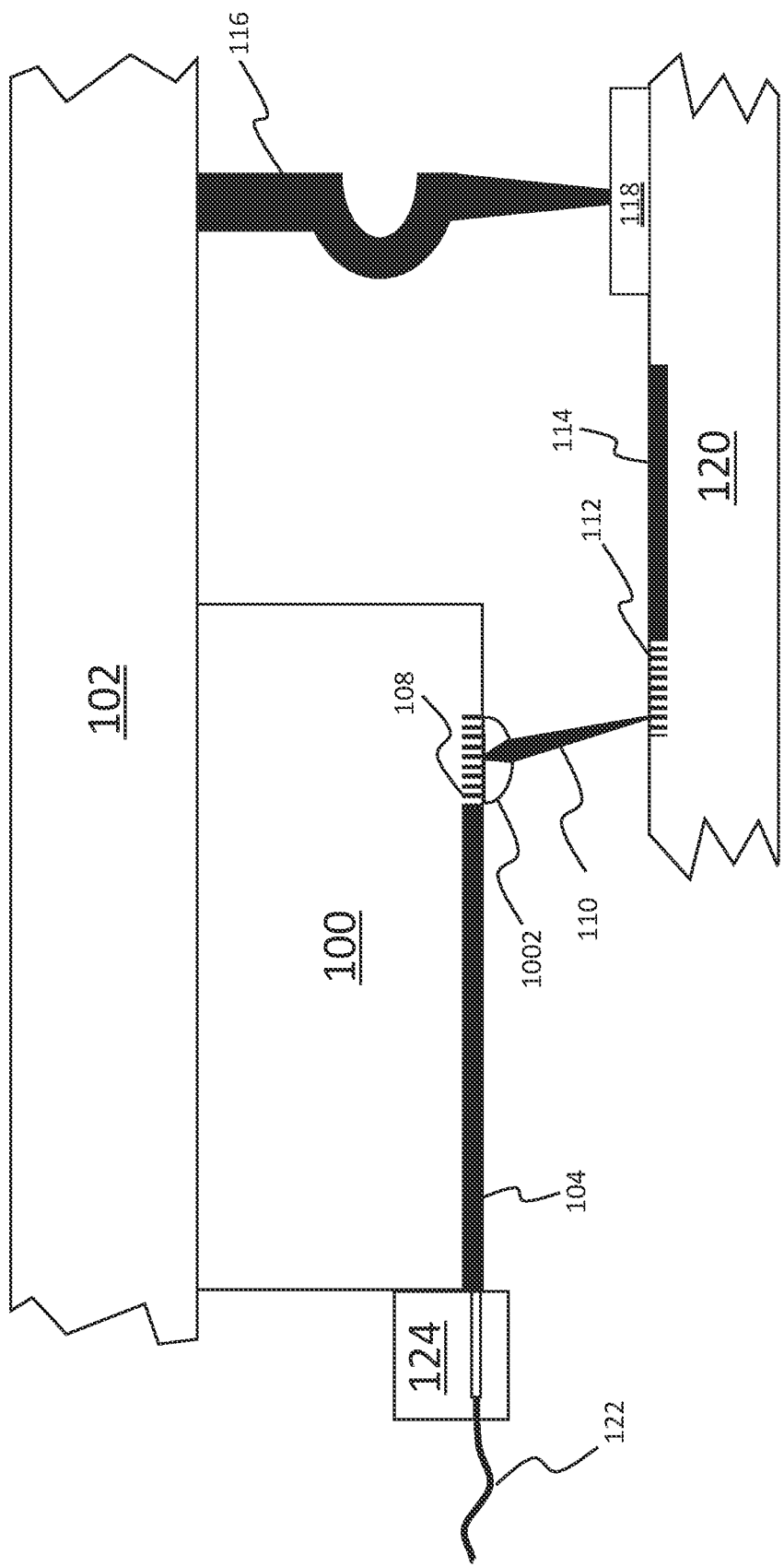
FIG. 10 is a schematic diagram of a portion of a system for testing a wafer, viewed from the side.

FIG. 10 shows a portion of a system used for testing the wafer 120. The chip-to-chip optical beam 110 can traverse through a micro-lens 1002 and have its optical mode correspondingly modified to image the grating coupler 108 to the grating coupler 112 (e.g., with an output beam waist at the grating coupler 112). In some implementations, a lens can be used that is configured to be tunable (e.g., using one or more electrical signals), such as a tunable focal length by tuning the index of refraction (e.g., by an electric field applied in response to one or more electrical signals). A position of the lens can also be adjusted and controlled (e.g., using a micro-electromechanical system). Such techniques can provide additional control over the coupling efficiency.

Figure 11:
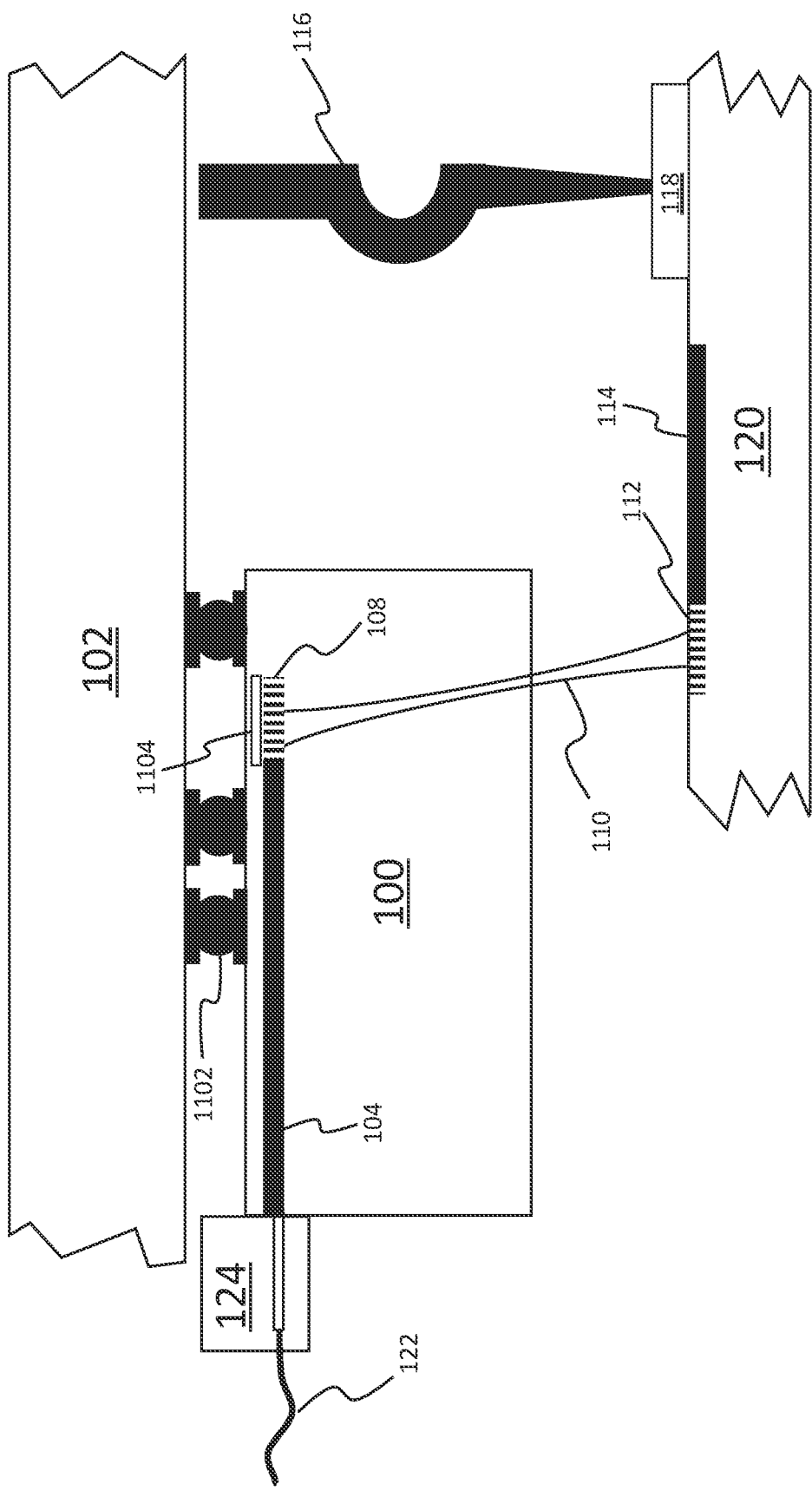
FIG. 11 is a schematic diagram of a portion of a system for testing a wafer, viewed from the side.

FIG. 11 shows a portion of a system used for testing the wafer 120. The chip-to-chip optical beam 110 is transmitted from the opposite side of the photonic signal interface module 100, so a reflective component 1104 can be used to ensure more of the light is transmitted through the thicker substrate of the photonic signal interface module 100. Alternatively, in some examples, the substrate can be thinned mechanically to reduce the propagation distance to the wafer 120. In some implementations, the reflective component 1104 can be concave or can be used in combination with a lens to image the grating coupler 108 to the grating coupler 112. In this example, there is no need for a TSV since the balls or copper pillars 1102 can be used to contact any active components in the photonic signal interface module 100 directly using electrical contacts on the surface of the electrical signal interface module 102.

Figure 12A:
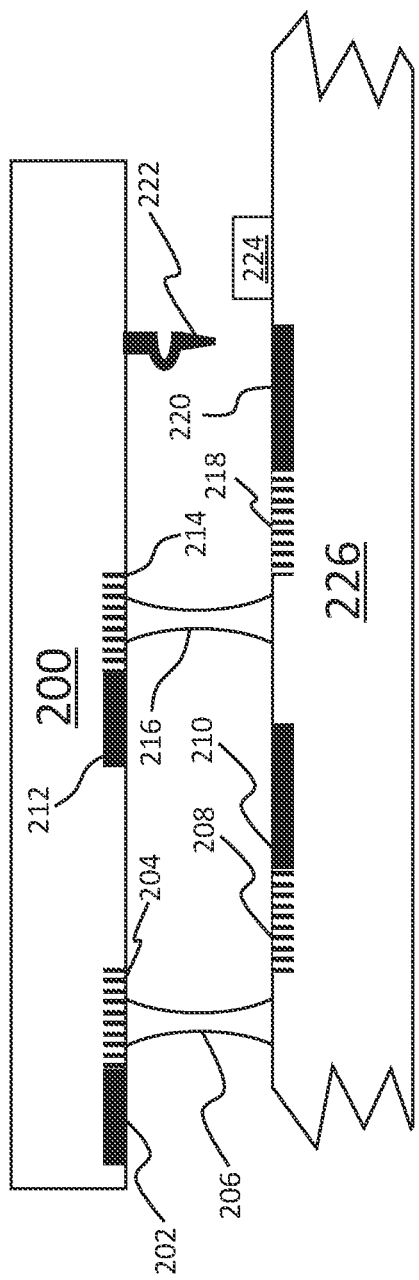
FIG. 12A is a schematic diagram of a portion of a system for testing a wafer, viewed from the side.
Figure 12B:
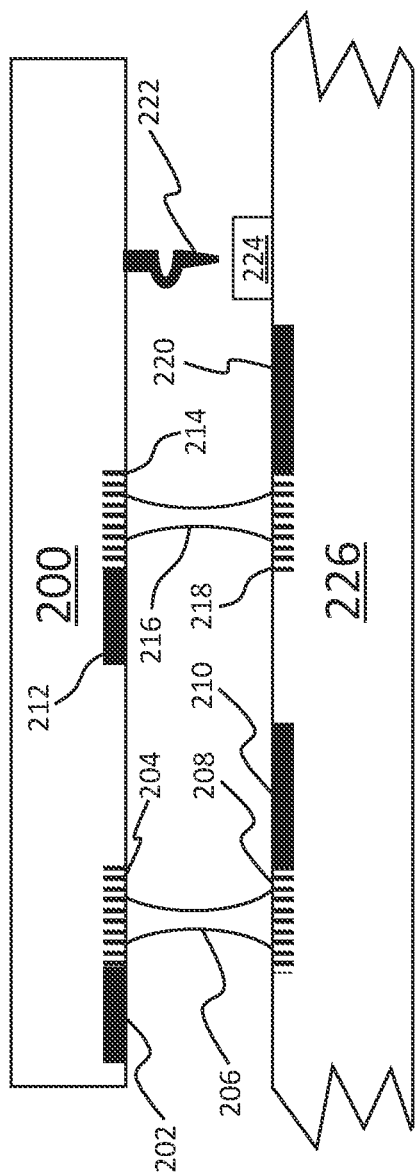
FIG. 12B is a schematic diagram of a portion of a system for testing a wafer, viewed from the side.
Figure 12C:
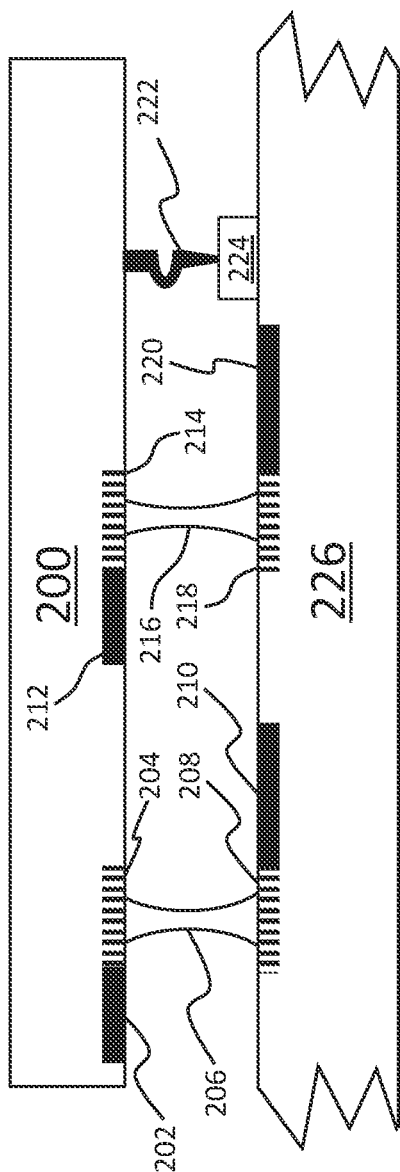
FIG. 12C is a schematic diagram of a portion of a system for testing a wafer, viewed from the side.

FIG. 12A-C show stages of alignment during a method for testing a wafer. In FIG. 12A, the grating couplers are horizontally misaligned. FIG. 12B shows a portion of the system used for testing the wafer 226 after horizontal alignment. Such horizontal alignment could be determined by detecting at least one photonic signal propagating between the photonic signal interface module 200 and the wafer 226 through at least one pair of the aligned grating couplers. FIG. 12C shows a portion of the system used for testing the wafer 226 after vertical alignment. Vertical alignment can be performed by positioning the photonic signal interface 200 relative to the wafer 226 to form electrical contacts between the array of spring coupled conducting structures and respective contact pads on the surface of the wafer while maintaining detection of the photonic signal during the positioning.

Figure 13A:
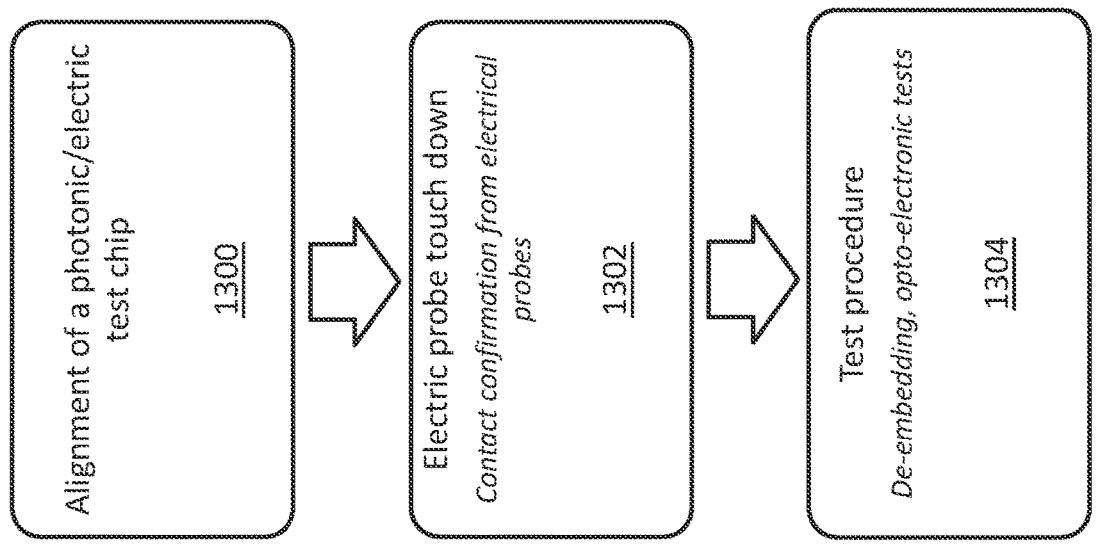

FIGS. 13A and 13B show flowcharts for procedures for aligning and testing a photonic signal interface module with a wafer.

In FIG. 13A, a high-level procedure for testing a wafer or chip comprising a photonic integrated circuit includes alignment of a photonic/electric test chip (1300), electric probe touch down (1302) with contact confirmation from electrical probes, and performing a test procedure (1304) with optoelectronic tests.

In FIG. 13B, a procedure for testing a wafer or chip comprising a photonic integrated circuit includes: aligning (1310) a first set of grating couplers on a testing module to a second set of grating couplers on a surface of the wafer or chip, where the testing module comprises an electrical signal interface module comprising an array of movable conducting structures, and a photonic signal interface module attached to the electrical signal interface module comprising one or more optical fiber interfaces, and the first set of grating couplers arranged over at least a first plane of the photonic signal interface module; detecting (1312) at least one photonic signal propagating between the photonic signal interface module and the wafer or chip through at least one pair of the aligned grating couplers; and positioning (1324) the testing module relative to the wafer or chip to form electrical contacts between the array of movable conducting structures and respective contact pads on the surface of the wafer or chip, and maintaining detection of the photonic signal during the positioning.

With some fiber array coupled systems, it is challenging to make space for a fiber array and its movements. A photonic chip interposer alleviates the mechanical constraints found with some fiber arrays, which may require space for a hole to fit the fiber array through. A photonic chip interposer allows for less obstruction, removing the necessity of tight tolerances for the addition of the fiber array.

Some fiber arrays may inject light into a surface grating coupler from the tips of the optical fibers. The quality of injection from the optical fiber tips is very sensitive to the angle of incidence with the wafer. This can be tuned, but it can be a tedious process and may require fine movement capacity along multiple axes. The grating coupler on the wafer may need to match the mode of a specific fiber which may limit the possible working distance and tolerances that need to be achieved.

When using a photonic chip interposer, the grating coupler on a wafer does not need to match the mode of a specific fiber, thus the grating coupler mode can be designed to relax the alignment tolerance requirements (such as longer working distance with wider mode) while also maintaining a good angular match with the wafer's grating coupler. In some implementations, the photonic chip interposer can be designed to output light in such a way that everything can be done at nearly a 0-degree angle, which reduces the need for tedious fine tuning, as well as make periodic maintenance of test setup easier.

When using a fiber array without a photonic chip interposer, designers may need to include arrays of grating couplers on the wafer matching the pitch of the fiber array. This may require designers to route light in a way that interferes with other design constraints, and may add additional superfluous design rules.

Fiber arrays may also require that grating couplers on the wafer are within a certain distance of each other, to match the capabilities of the movement stages. Failure to have grating couplers within this distance may increase test and touch time by requiring devices on a wafer to be tested in more steps than would be needed with the use of a photonic chip interposer. In contrast, the photonic chip interposer can be designed in any geometric configuration, and thus can be custom made to match the corresponding DUT arrangement on a wafer. This removes the restriction for routing light very precisely to a regularly pitched array of grating couplers that must match the fiber array used for measurements. By appropriately designing the photonic chip interposer, it is possible to create a mask that will overlay with device being tested on wafer with increased accuracy. This chip can be as big as the tested dies on the wafer, allowing easy access to more, or all, grating couplers on the die, and may remove at least some superfluous design rules.

Some fiber array couplers may also be incompatible with some probe cards. This means that custom probe setups may need to be used, rather than standardized probe cards with multiple points of contact. A photonic chip interposer allows for a system that alleviates mechanical restrictions in a way that would make it possible to adapt to standardized probe card technologies. Etched cut outs or an undersized light injection chip, for example, could accommodate the electrical probes on probe cards. Additionally, the use of a photonic chip interposer facilitates supplementary functions located on the photonic chip interposers, such as variable optical attenuators, polarization rotators, reflectors, delay lines, and photodetectors.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An apparatus for testing a wafer or chip comprising a photonic integrated circuit, the apparatus comprising:
    an electrical signal interface module comprising an array of movable conducting structures;
    a photonic signal interface module attached to the electrical signal interface module, the photonic signal interface module comprising
        one or more optical fiber interfaces, and
        a first set of grating couplers arranged over at least a first plane of the photonic signal interface module; and
    one or more electrical signal connections between the electrical signal interface module and the photonic signal interface module.

2. The apparatus of claim 1, wherein the wafer or chip comprises a second set of grating couplers on a surface of the wafer or chip, and a spatial arrangement of the first set of grating couplers is substantially identical to a spatial arrangement of the second set of grating couplers.

3. The apparatus of claim 2, wherein a first grating coupler in the first set of grating couplers has a substantially identical shape as a second grating coupler in the second set of grating couplers, and the shapes of the first and second grating couplers are rotated by 180 degrees with respect to each other when in proximity to each other after the arrangement of the first set of grating couplers is aligned to the arrangement of the second set of grating couplers.

4. The apparatus of claim 1, wherein the wafer or chip comprises a second set of grating couplers on a surface of the wafer or chip, and the photonic signal interface module further comprises at least one photodetector coupled to at least one photonic signal propagating between the photonic signal interface module and the wafer or chip through at least one pair of aligned grating couplers consisting of a grating coupler in the first set of grating couplers and a grating coupler in the second set of grating couplers.

5. The apparatus of claim 1, wherein the photonic signal interface module further comprises a photonic circuit that comprises at least one optical splitter configured to couple portions of photonic signals including a first portion being coupled to or from the wafer or chip and a second portion being coupled to a photodetector on the photonic signal interface module coupled to at least one of the electrical signal connections.

6. The apparatus of claim 5, wherein the optical splitter is configured to couple the first portion to the wafer or chip and the second portion to a first photodetector on the photonic signal interface module coupled to at least one of the electrical signal connections, and the optical splitter is configured to couple a third portion reflected from a Sagnac loop retro-reflector in the wafer or chip to a second photodetector on the photonic signal interface module coupled to at least one of the electrical signal connections.

7. The apparatus of claim 1, wherein the photonic signal interface module further comprises an interferometric photonic circuit that comprises at least one optical phase shifter configured to apply an optical phase shift to a photonic signal based on an electrical signal propagating between the electrical signal interface module and the photonic signal interface module through at least one of the electrical signal connections.

8. The apparatus of claim 1, wherein the first plane of the photonic signal interface module is coincident with a surface of the photonic signal interface module that is in proximity to a surface of the wafer or chip.

9. A method for fabricating a testing module for testing a wafer or chip comprising a photonic integrated circuit, the method comprising:
    forming an electrical signal interface module comprising an array of movable conducting structures;
    forming a photonic signal interface module attached to the electrical signal interface module, the photonic signal interface module comprising one or more optical fiber interfaces, and
        a first set of grating couplers arranged over at least a first plane of the photonic signal interface module; and
    forming one or more electrical signal connections between the electrical signal interface module and the photonic signal interface module.

10. The method of claim 9, wherein the wafer or chip comprises a second set of grating couplers on a surface of the wafer or chip, and a spatial arrangement of the first set of grating couplers is substantially identical to a spatial arrangement of the second set of grating couplers.

11. The method of claim 10, wherein a first grating coupler in the first set of grating couplers has a substantially identical shape as a second grating coupler in the second set of grating couplers, and the shapes of the first and second grating couplers are rotated by 180 degrees with respect to each other when in proximity to each other after the arrangement of the first set of grating couplers is aligned to the arrangement of the second set of grating couplers.

12. The method of claim 9, wherein the wafer or chip comprises a second set of grating couplers on a surface of the wafer or chip, and the photonic signal interface module further comprises at least one photodetector coupled to at least one photonic signal propagating between the photonic signal interface module and the wafer or chip through at least one pair of aligned grating couplers consisting of a grating coupler in the first set of grating couplers and a grating coupler in the second set of grating couplers.

13. The method of claim 9, wherein the photonic signal interface module further comprises a photonic circuit that comprises at least one optical splitter configured to couple portions of photonic signals including a first portion being coupled to or from the wafer or chip and a second portion being coupled to a photodetector on the photonic signal interface module coupled to at least one of the electrical signal connections.

14. The method of claim 9, wherein the photonic signal interface module further comprises an interferometric photonic circuit that comprises at least one optical phase shifter configured to apply an optical phase shift to a photonic signal based on an electrical signal propagating between the electrical signal interface module and the photonic signal interface module through at least one of the electrical signal connections.

15. A method for testing a wafer or chip comprising a photonic integrated circuit, the method comprising:
   aligning a first set of grating couplers on a testing module to a second set of grating couplers on a surface of the wafer or chip, where the testing module comprises
      an electrical signal interface module comprising an array of movable conducting structures, and
      a photonic signal interface module attached to the electrical signal interface module comprising one or more optical fiber interfaces, and the first set of grating couplers arranged over at least a first plane of the photonic signal interface module;
   detecting at least one photonic signal propagating between the photonic signal interface module and the wafer or chip through at least one pair of the aligned grating couplers; and
   positioning the testing module relative to the wafer or chip to form electrical contacts between the array of movable conducting structures and respective contact pads on the surface of the wafer or chip, and maintaining detection of the photonic signal during the positioning.

16. The method of claim 15, wherein positioning the testing module relative to the wafer or chip comprises controlling a controllable lens that in proximity to at least one grating coupler in the first set of grating couplers.

17. The method of claim 16, wherein controlling the controllable lens comprises at least one of: tuning an index of refraction of the lens using an electric field applied in response to an electrical signal from the electrical signal interface module, or adjusting a position of the lens using a micro-electromechanical system controlled based on an electrical signal from the electrical signal interface module.

18. The method of claim 15, wherein a spatial arrangement of the first set of grating couplers is substantially identical to a spatial arrangement of the second set of grating couplers.

19. The method of claim 18, wherein a first grating coupler in the first set of grating couplers has a substantially identical shape as a second grating coupler in the second set of grating couplers, and the shapes of the first and second grating couplers are rotated by 180 degrees with respect to each other when in proximity to each other after the arrangement of the first set of grating couplers is aligned to the arrangement of the second set of grating couplers.

20. The method of claim 15, wherein the photonic signal interface module comprises at least one photodetector coupled to at least one photonic signal propagating between the photonic signal interface module and the wafer or chip through at least one pair of aligned grating couplers consisting of a grating coupler in the first set of grating couplers and a grating coupler in the second set of grating couplers.

21. The method of claim 15, wherein the photonic signal interface module comprises a photonic circuit that comprises at least one optical splitter configured to couple portions of photonic signals including a first portion being coupled to or from the wafer or chip and a second portion being coupled to a photodetector on the photonic signal interface module coupled to at least one of the electrical signal connections.

* * * * *